(12) United States Patent
Leigh et al.

(10) Patent No.: US 11,452,208 B2
(45) Date of Patent: Sep. 20, 2022

(54) ELECTRONIC DEVICES PACKAGED ON WING BOARDS

(71) Applicant: HEWLETT PACKARD ENTERPRISE DEVELOPMENT LP, Houston, TX (US)

(72) Inventors: Kevin Leigh, Houston, TX (US); John Norton, Houston, TX (US); George D. Megason, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 502 days.

(21) Appl. No.: 16/487,249

(22) PCT Filed: Feb. 24, 2017

(86) PCT No.: PCT/US2017/019467
§ 371 (c)(1),
(2) Date: Aug. 20, 2019

(87) PCT Pub. No.: WO2018/156151
PCT Pub. Date: Aug. 30, 2018

(65) Prior Publication Data
US 2020/0383207 A1 Dec. 3, 2020

(51) Int. Cl.
*G06F 1/18* (2006.01)
*H05K 1/14* (2006.01)
(Continued)

(52) U.S. Cl.
CPC ............. *H05K 1/148* (2013.01); *G06F 1/186* (2013.01); *G06F 1/3296* (2013.01);
(Continued)

(58) Field of Classification Search
CPC ...... H05K 1/148; H05K 1/0281; H05K 1/189; H05K 2201/10159; H01L 23/4093;
(Continued)

(56) References Cited

U.S. PATENT DOCUMENTS

| | | | |
|---|---|---|---|
| 5,926,369 A | 7/1999 | Ingraham et al. | |
| 6,709,276 B2 * | 3/2004 | Barringer ............. | H05K 7/1424 361/752 |

(Continued)

FOREIGN PATENT DOCUMENTS

CN 103488256 A 1/2014

OTHER PUBLICATIONS

International Search Report and Written Opinion received for PCT Application No. PCT/US2017/019467, dated Nov. 22, 2017, 11 pages.

*Primary Examiner* — Cheng Yuan Tseng
(74) *Attorney, Agent, or Firm* — Hewlett Packard Enterprise Patent Department

(57) ABSTRACT

Example implementations relate to an electronic device packaged on a wing board. For example, an implementation includes a base board having a planar signal interface to couple parallelly to a signal interface segment of a system board. The example implementation also includes a plurality of wing boards to scale in a direction perpendicular to a plane of the base board. An electronic device is packaged on each of the wing boards. A flexible circuit flexibly links at least one of the wing boards to the base board and has a signal path to communicatively couple the planar signal interface and an electronic device packaged the wing board.

18 Claims, 10 Drawing Sheets

(51) Int. Cl.
  *G06F 1/3296* (2019.01)
  *G06F 13/40* (2006.01)
  *H01L 23/473* (2006.01)
  *H01L 25/18* (2006.01)
  *H05K 1/02* (2006.01)
  *H05K 1/18* (2006.01)
  *H01L 23/40* (2006.01)

(52) U.S. Cl.
  CPC ........ *G06F 13/4068* (2013.01); *H01L 23/473* (2013.01); *H01L 25/18* (2013.01); *H05K 1/0281* (2013.01); *H05K 1/189* (2013.01); *H01L 23/4093* (2013.01); *H05K 2201/10159* (2013.01)

(58) Field of Classification Search
  CPC ... H01L 23/23473; H01L 25/18; G06F 1/186; G06F 1/3296; G06F 13/4068
  See application file for complete search history.

(56) References Cited

U.S. PATENT DOCUMENTS

| | | | |
|---|---|---|---|
| 6,822,878 B2* | 11/2004 | Dobbs | H05K 1/148 |
| | | | 361/752 |
| 7,703,889 B2* | 4/2010 | Ito | H05K 3/4007 |
| | | | 347/50 |
| 8,864,500 B1 | 10/2014 | Bhakta et al. | |
| 9,357,648 B2 | 5/2016 | Johnson et al. | |
| 9,549,470 B2* | 1/2017 | Blier | G02B 6/4246 |
| 9,924,610 B2* | 3/2018 | Chiasson | G11B 33/124 |
| 10,211,556 B2* | 2/2019 | Ryu | G09G 5/006 |
| 10,292,268 B2* | 5/2019 | Shui | H05K 1/147 |
| 2003/0061696 A1 | 4/2003 | Staiger | |
| 2006/0209515 A1 | 9/2006 | Moshayedi | |
| 2008/0043405 A1 | 2/2008 | Lee et al. | |
| 2009/0046437 A1* | 2/2009 | Hsieh | H05K 7/1431 |
| | | | 361/752 |
| 2010/0158535 A1* | 6/2010 | Chou | H05K 1/14 |
| | | | 398/135 |
| 2010/0307798 A1 | 12/2010 | Izadian | |
| 2012/0050975 A1* | 3/2012 | Garelli | G06F 1/181 |
| | | | 361/679.01 |
| 2014/0203175 A1 | 7/2014 | Kobrinsky et al. | |
| 2014/0241062 A1 | 8/2014 | Jeseritz et al. | |
| 2014/0268538 A1* | 9/2014 | Newbert | H01R 31/06 |
| | | | 439/502 |
| 2014/0269240 A1* | 9/2014 | Phelan | G11B 33/122 |
| | | | 362/418 |
| 2016/0050768 A1* | 2/2016 | Chen | H01L 24/20 |
| | | | 361/728 |
| 2016/0183374 A1 | 6/2016 | Prakash et al. | |
| 2016/0282652 A1* | 9/2016 | Kuk | G02F 1/13452 |

* cited by examiner

ELECTRONIC DEVICES PACKAGED ON WING BOARDS

BACKGROUND

Some electronic systems, such as computers, may include a processor and memory. Some electronic systems may include a system board with a connector to receive an expansion card or the like. In some cases, the expansion card may be hot-pluggable.

BRIEF DESCRIPTION OF THE DRAWINGS

Various examples will be described below with reference to the following figures.

Figure 1:
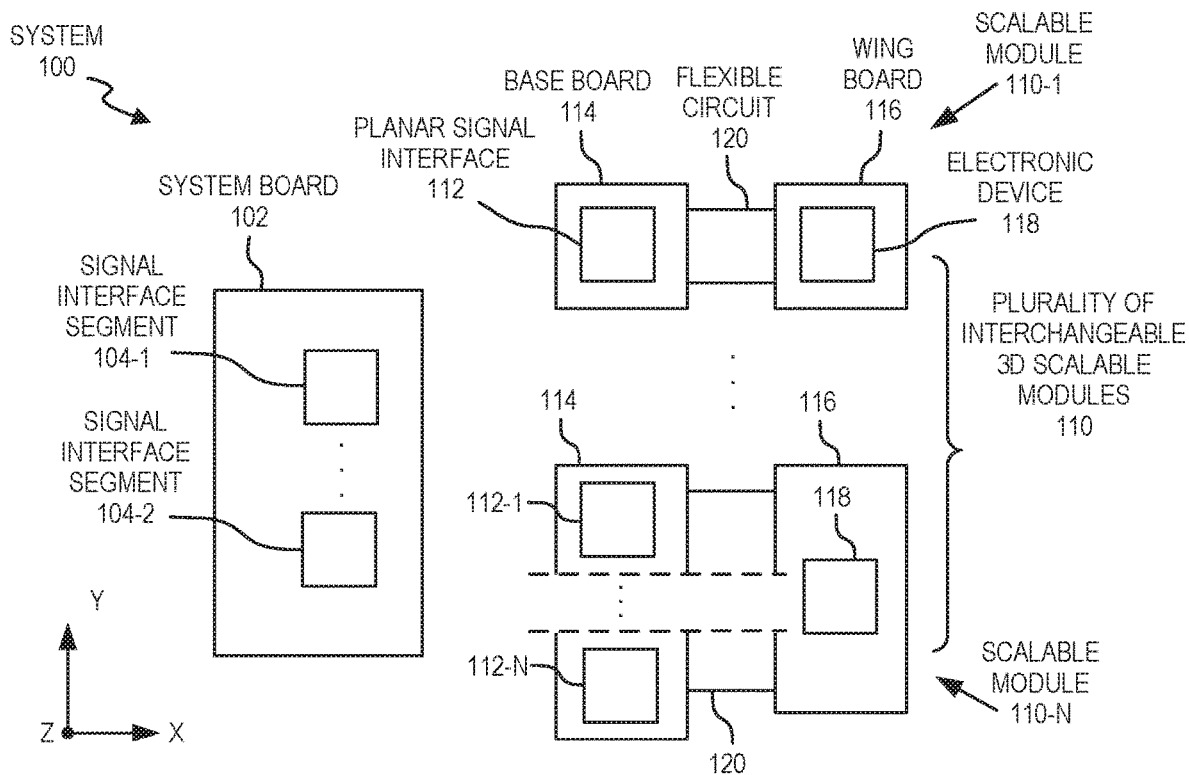
FIG. 1 is a block diagram of an example system that includes a plurality of interchangeable three-dimensionally scalable modules.

Throughout the drawings, identical reference numbers may designate similar, but not necessarily identical, elements. A hyphenated index number "N" appended to some of the reference numerals may be understood to merely denote plurality, Additionally, use herein of a reference numeral without a hyphenated index number, where such reference numeral is referred to elsewhere with a hyphenated index number, may be a general reference to the corresponding plural elements, collectively or individually.

DETAILED DESCRIPTION

Some electronic systems, such as computing, memory, or storage systems, may support expansion modules. Expansion modules may be installed to an electronic system to provide processing capabilities and/or to provide high-capacity memory, for example.

A card with an edge connector is one example of an expansion module. However, cards with edge connectors may be too tall or wide to be installed in certain systems (e.g., 1U server). Additionally, cards with edge connectors carrying large amounts of memory may present electrical signal integrity challenges due to long signal path lengths between the edge connector and some of the memory chips. Edge connectors also may not be able to support high-speed signals. Moreover, thermal management elements, and liquid cooling in particular, may be not easily adapted to electronic systems using cards with edge connectors. Cards with edge connectors may provide limited or no scalability.

Accordingly, it may be useful to provide a flexible three-dimensionally scalable architecture for a hot-pluggable module that can support various types of system expansion (e.g., high capacity memory, various types of processors, etc.), high signal bandwidth, various thermal management demands, and a range of spatial constraints.

Referring now to the figures, FIG. 1 is a block diagram of an example system 100. The system 100 includes a system board 102 having a plurality of signal interface segments 104-1 through 104-N (also referred to generally as a signal interface segment or segments 104) and a plurality of interchangeable three-dimensionally scalable (3-D scalable) modules 110-1 through 110-N (referred to generally as a 3-D scalable module or modules 110). As will be described further below, each of interchangeable 3-D scalable modules 110 may be connected to or removed from one or more of the signal interface segments 104.

The system board 102 may be a system board or main board of an electronic system such as a server, workstation, storage system, a desktop computer, or the like. The system board 102 may be a printed circuit board that holds various subsystems and enables communication between subsystems, such as a processing resource (e.g., central processing unit), memory, controllers, peripherals, or power.

The signal interface segments 104 may be connected to subsystems of the system board 102 via traces, wires, optical waveguides or fibers, or the like. A signal interface segment 104 may include an optical interface, an electrical interface, both an optical interface and an electrical interface, or electro-optical interface. In some implementations, a signal interface segment 104 may include an array of contacts or the like, such as an eight lane array. Moreover, a signal interface segment may have contacts for high-speed data signals (e.g., 25 Gbps/lane), management signals, power, or any combination of the foregoing. In some implementations, a signal interface segment 104 may be accompanied by a socket, mechanical features (e.g., keying, pins, etc.), or the like, for aligning, mating, and retaining a 3-D scalable module 110.

Each of the plurality of interchangeable 3-D scalable modules 110 includes a planar signal interface 112, a base board 114, a wing board 116, an electronic device 118, and a flexible circuit 120. The planar signal interface 112 is to parallelly couple to a signal interface segment 104 of the system board 102. For example, the planar signal interface 112 may be an array of contacts complementary to an array of contacts forming a signal interface segment 104, and the planar signal interface 112 may couple to the signal interface segment 104 by mating their respective arrays face-to-face. Similar to the signal interface segment 104 to which it mates, the planar signal interface 112 may include an optical interface, an electrical interface, both an optical interface and an electrical interface, or electro-optical interface. The interface between the planar signal interface 112 and the signal interface segment 104 may be a high-speed connection. The base board 114 retains the planar signal interface 112, In other words, the planar signal interface 112 is disposed on the base board 114.

The electronic device 118 is packaged or disposed on the wing board 116. A wing board 116 may carry any number (e.g., one or more) and type of electronic devices 118. For example, the electronic device 118 may be any type of memory, organized as a bank of memory chips for example, such as Random Access Memory (RAM) (e.g., dynamic RAM (DRAM)), flash memory, memristor memory, spin-transfer torque memory, or other volatile or non-volatile memory, and may also carry a memory controller. In some implementations, the electronic device 118 may include a general purpose processing resource or a special purpose processing resource, Example processing resources include a system on chip (SoC), an encryption processor, a graphics processing unit (GPU), a central processing unit (CPU), a field-programmable gate array (FPGA), an application specific integrated circuit (ASIC), or any other processing resource.

The flexible circuit 120 serves as a flexible linkage between the base board 114 and the wing board 116. In some implementations, the flexible circuit 120 may be non-removably integral to both the base board 114 and the wing board 116. For example, in some implementations, both the base board 114 and the wing board 116 are rigid printed circuit boards (PCBs), and the flexible circuit 120 is a flexible substrate (e.g., flexible conductor traces embedded within polyimide dielectric films, or other flexible media) extended between the base board 114 and the wing board 116 in manufacturing. In other implementations, the flexible circuit may be removably coupled to the base board 114 and/or the wing board 116, which may be useful for interchanging different length flexible circuits, modularly swapping types of wing boards 116 connected to a base board 114, or adding or removing a wing board 116 from a base board 114.

The flexible circuit 120 also includes a signal path to communicatively couple the electronic device 118 and the planar signal interface 112. In some implementations, the signal path may be electrical traces or optical waveguides integrated on or embedded within a flexible medium of the flexible circuit 120 and running between the planar signal interface 112 and the electronic device 118. Accordingly, when a 3-D scalable module is mated to the system board 102, via coupling of the planar signal interface 112 to the signal interface segment 104, the electronic device 118 may communicate with subsystems of the system board 102 and, more generally, with the electronic system in which the system board 102 resides.

Moreover, different ones of the plurality of interchangeable 3-D scalable modules 110 may employ different electronic devices 118. To illustrate, an example scalable module may employ memory devices, and that scalable module may be mated to the system board 102 to provide memory to the electronic system in which the system board 102 resides. More particularly, in some examples, a memory-based scalable module 110 may employ, and be selected for, memory having certain characteristics related to volatility, capacity, speed, cost, power consumption, etc. As another illustration, another example scalable module 110 may employ a GPU as its electronic device 118, and that example scalable module 110 may be mated to the system board 102 to provide GPU-based computational capabilities to the electronic system. As another illustration, another example scalable module 110 may employ an SoC as its electronic device 118 to provide a variety of customizable functionality to the electronic system.

At least some of the 3-D scalable modules 110 have different numbers or configurations of planar signal interfaces 112 to removably couple to different numbers of the signal interface segments 104. To illustrate, a first example module (e.g., 110-1) may have a single base board 114 with one planar signal interface 112 to couple to one signal interface segment 104 on the system board 102. A second example module (e.g., 110-N) may have a base board 114 with more than one planar signal interface (e.g., 112-1 through 112-N at module 110-N) to couple to more than one signal interface segment 104 of the system board 102. In other illustrations, an example module (e.g., 110-N) may have multiple independent base boards 114 (e.g., independently movable), each base board 114 having one or more planar signal interfaces 112, and such base boards 114 may be connected to one or more wing boards 116 by one or more flexible circuits 120. It should be understood that different 3-D scalable modules 110 may have different configurations between base boards 114 and planar signal interfaces 112 (e.g., one-to-one or one-to-many, respectively) and between base boards 114 and wing boards 116 (e.g., one-to-one, one-to-many, many-to-one, or many-to-many, respectively).

By virtue of coupling to more than one signal interface segment 104, the second example module (110-N in the illustration above) with more than one planar signal interface may have an increased communication bandwidth to the system board 102 in comparison to the first example module (110-1 in the illustration above) with one planar signal interface. On the other hand, the footprint of the planar signal interfaces 112 of the first example module (110-1) may be smaller than a footprint of the planar signal interfaces 112-1 through 112-N of the second example module (110-N). Accordingly, the plurality of 3-D scalable modules 110 may be understood to scale (that is, amenable to different designs and configurations) in a plane of the planar signal interfaces 112 (e.g., X-Y plane), in terms of spatial footprint and/or available bandwidth, among other aspects.

In some implementations, a 3-D scalable module 110 may have planar signal interfaces of different types. For example, a 3-D scalable module 110 may have two planar signal interfaces 112 to parallelly couple to two signal interface segments 104 of the system board 102. A first planar signal interface may be an optical interface, while a second planar signal interface may be an electrical interface. Other numbers and combinations of planar signal interface types also may be contemplated.

In some implementations, at least some of the 3-D scalable modules 110 may have different numbers or configurations of wing boards 116. In some case, a 3-D scalable module 110 may include a plurality of wing boards 116 that scale dimensionally in a direction (e.g., Z-direction) perpendicular to a plane of a base board 114 (e.g., X-Y plane), For example, wing boards 116 may be stacked in parallel to the base board 114 or may be perpendicular to of the base board 114. Some example configurations of wing boards 116 will be described further herein below.

In some implementations, a 3-D scalable module 110 may include thermal management elements positioned on or around the base board 114 and/or the wing board(s) 116, For example, in some implementations, the thermal management elements may be interleaved between wing boards 116. The thermal management elements may be air-cooled heat sinks in some cases. In other cases, a 3-D scalable module 110 may employ liquid cooling plates interleaved with wing boards 116 of the module, and the liquid cooling plates may also include a main cooling plate in thermal contact with a base board 114 of the module 110. Liquid cooling plates may be used with thermally dense modules 110, such as modules 110 that employ a GPU as an electronic device 118.

The 3-D scalable modules 110 are interchangeable, such that different modules 110 may be removed or added to the system board 102 as appropriate for different workloads. In some implementations, the 3-D scalable modules 110 may be hot-pluggable and front-serviceable to an electronic system in which the system board 102 is installed. In some implementations, the 3-D scalable may be hot-pluggable and top-serviceable to an electronic system in which the system board 102 is installed. Hot-plugging may be understood to mean capable of being added to an electronic system without restarting or interrupting the electronic system.

Figure 2:
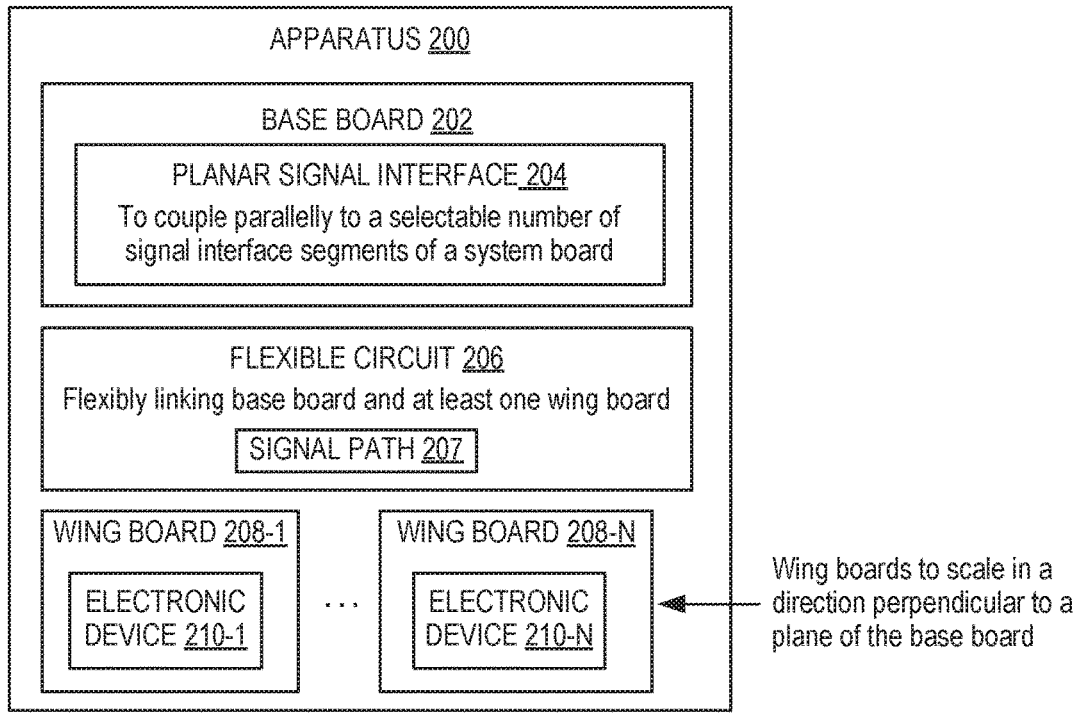
FIG. 2 is a block diagram of an example apparatus that includes a base board, wing boards, and an electronic device packaged on each wing board.

FIG. 2 is a block diagram of an example apparatus 200. The apparatus 200 includes a base board 202, planar signal interfaces 204, a flexible circuit 206, wing boards 208-1 through 208-N (also referred to generally as a wing board or wing boards 208), and electronic devices 210-1 through 210-N (also referred to generally as an electronic device or devices 210). In some implementations, the apparatus 200 may serve as or form part of a 3-D scalable module 110 described above with reference to FIG. 1.

The base board 202 has a planar signal interface 204 to couple parallelly to a selectable number of signal interface segments of a system board (e.g., segments 104 of system board 102 described above). In some cases, the planar signal interface 204 may be one or more interfaces (e.g., analogous in many respects to interface(s) 112 described above). The number of system board signal interface segments to which the planar signal interface 204 couples may be selected by virtue of design and/or by virtue of coupling a desired number of independent interfaces making up the planar signal interface 204.

At least one of the wing boards 208 is flexibly linked to the base board 202 via the flexible circuit 206. In some implementations, the flexible circuit 206 is non-removably integral to the base board 202 and non-removably integral to the at least one of the wing boards 208. For example, the flexible circuit 206 may form part of a lamination of the base board 202 and part of a lamination of at least one of the wing boards 208. In some implementations, the flexible circuit 206 may be removable from the base board 202 or the wing board(s) 208. The flexible circuit 206 has a signal path 207, which may communicatively couple (e.g., transmits signal, data, power, etc.) the boards connected by the flexible circuit 206, and in a particular case, may communicatively couple the planar signal interface 204 and an electronic device 210 packaged on a wing board 208.

In some implementations, all wing boards 208 of an apparatus 200 may be connected to a base board 202 in the foregoing manner by one or more flexible circuits 206. In other implementations, some wing boards (e.g., 208-1) may be connected to other wing boards (e.g., 208-2) by flexible circuit(s), and some of those other wing boards (e.g. 208-2) may then be connected in turn to the base board 202 by a flexible circuit.

The plurality of wing boards 208 scale in a direction perpendicular to a plane of the base board 202. In some implementations, each of the plurality of wing boards 208 is coupled to the base board 202 by a respective flexible circuit 206, each wing board of the plurality of wing boards 208 is parallel to each other, and the wing boards 208 are perpendicular to the plane of the base board 202 (e.g., an example is described below with respect to FIGS. 3A, 3B, 4A, 4B, 6A, 6B, 6C). In some implementations, each of the plurality of wing boards 208 is coupled to the base board 202 by a respective flexible circuit 206, and the wing boards 208 are stacked in parallel to the base board 202 (e.g., an example is described below with respect to FIG. 7). In some implementations, the plurality of wing boards 208 includes a first wing board (e.g., 208-1) and a second wing board (e.g., 208-2), the first wing board (e.g., 208-1) is flexibly linked to the base board 202 via a first flexible circuit, the second wing board (e.g., 208-2) is flexibly linked to the first wing board (e.g., 208-1) by a second flexible circuit, and the base board 202, the first wing board (e.g., 208-1), and the second wing board (e.g., 208-2) wrap around a support block (e.g., an example is described below with respect to FIGS. 5A and 5B).

An electronic device 210 is disposed or packaged on each of the wing boards 208. Some examples of an electronic device 210 include memory, a system on chip, an encryption processor, a computing processor, or a graphics processing unit. In some implementations, thermal management elements (e.g., air-cooled heat sinks, liquid cooling plates, etc.) may be interleaved with the plurality of wing boards 208.

In some implementations, the apparatus 200 (i.e., the base board 202, the plurality of wing boards 208, etc.) is packaged in a hot-pluggable and front-serviceable electronic system module. In other implementations, the apparatus 200 is packaged in a hot-pluggable and top-service electronic system module.

Figure 3A:
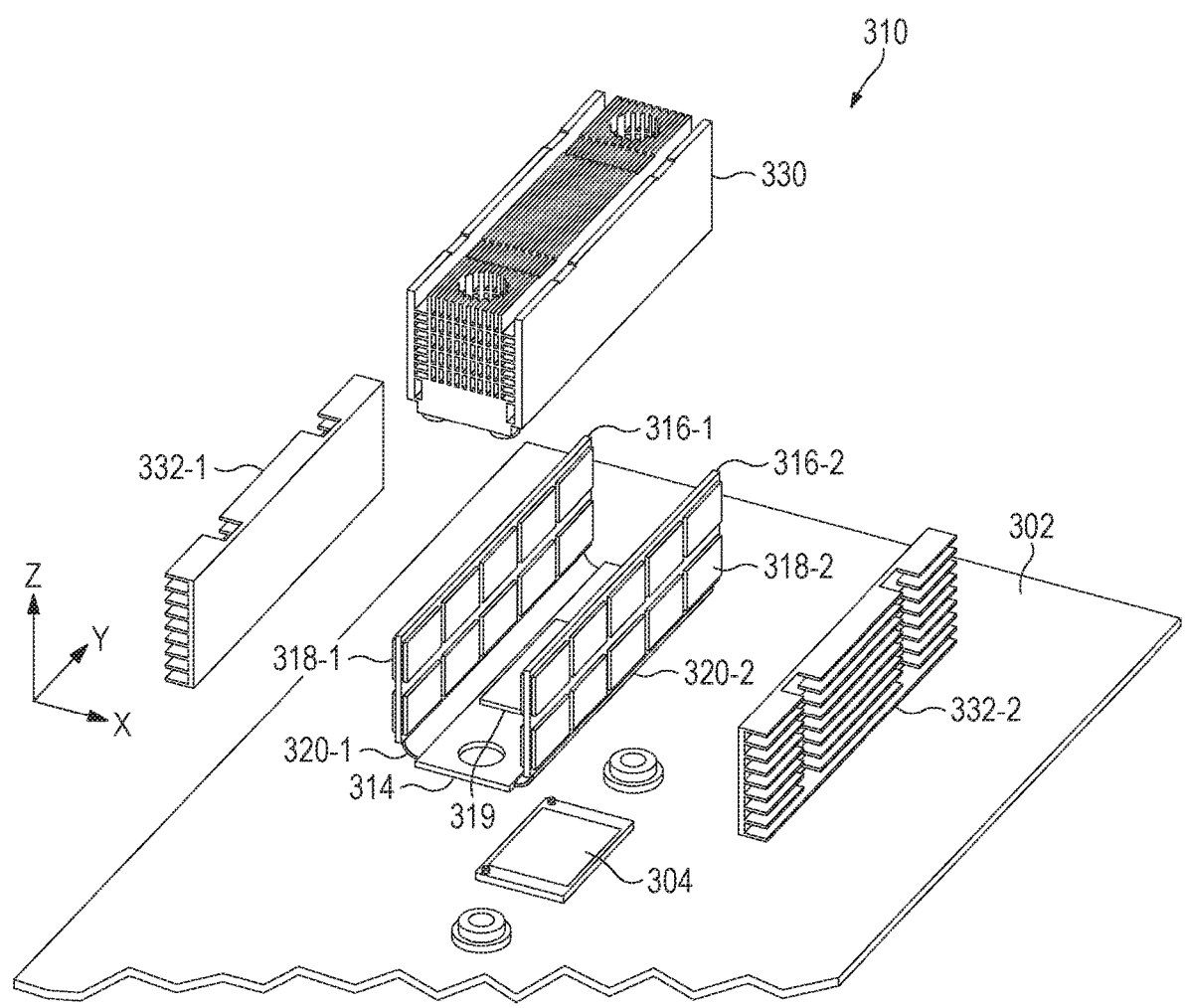
FIG. 3A depicts an example three-dimensionally (3-D) scalable module in an exploded perspective view.
Figure 3B:
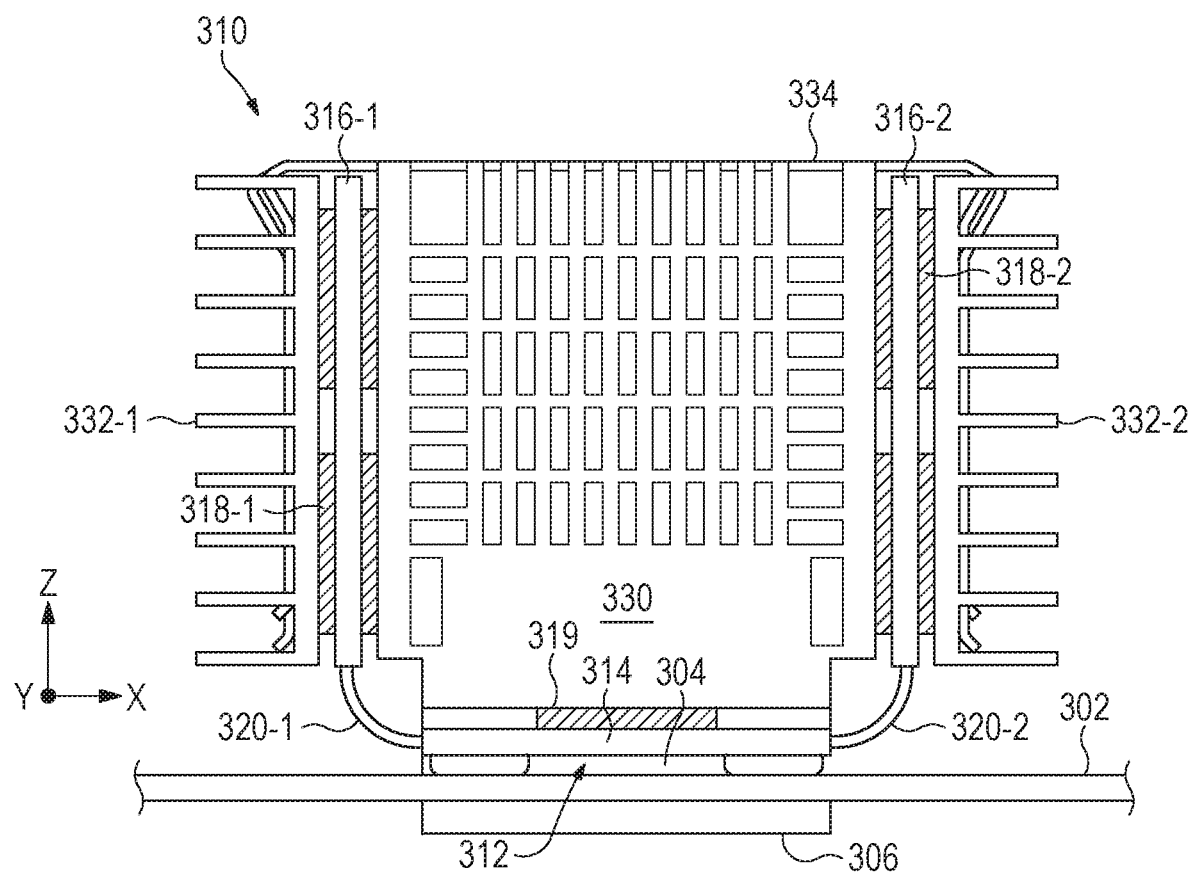
FIG. 3B depicts the example 3-D scalable module of FIG. 3A assembled and in a front view.

FIGS. 3A and 3B depict an example 3-D scalable module 310. In particular, FIG. 3A depicts the 3-D scalable module 310 in an exploded view, and FIG. 3B depicts the 3-D scalable module 310 assembled and in a front view. The 3-D scalable module 310 includes a base board 314, a planar signal interface 312, wing boards 316-1 and 316-2, and electronic devices 318-1 and 318-2 disposed respectively on the wing boards 316-1 and 316-2. The planar signal interface 312 is on an under side of the base board 314, as indicated in FIG. 3B.

The 3-D scalable module 310 can mate to the system board (as shown in FIG. 36) by virtue of parallel coupling of the planar signal interface 312 to a signal interface segment 304 on a system board 302. The system board 302 may be installed in an electronic system. In some implementations, the system board 302 may have a bolster plate 306 in a region of the signal interface segment 304 to provide mechanical support. The signal interface segment 304 may be accompanied by a socket, alignment, and/or retention features to assist mating with the 3-D scalable module 310.

The wing boards 316-1 and 316-2 are in a vertical orientation (e.g. positioned along the Y-Z plane), that is, the wing boards 316-1 and 316-2 are parallel to each other and perpendicular to the plane of the base board 314 (e.g., along the X-Y plane). The wing boards 316-1 and 316-2 may be arranged in other orientations as well, such as oblique or angled orientations relative to the base board 314.

A flexible circuit 320-1 connects the wing board 316-1 to the base board 314, and a flexible circuit 320-2 connects the wing board 316-2 to the base board 314. The flexible circuits 320-1 and 320-2 may have traces or the like to transmit data and/or power between the electronic devices 318-1 and 318-2 on respective wing boards and the base board 314. The electronic devices 318-1 and 318-2 may be, for example, memory chips, although other devices may be employed. In some implementations, the base board 314 may also carry an electronic device 319, such as, for example, a memory controller.

The 3-D scalable module 310 may also include air-cooled heat sinks. For example, the heat sinks may be interleaved with the wing boards. More particularly, a center heat sink 330 may be positioned between the wing boards 316-1 and 316-2 and the base board 314, to extract heat from electronic devices 318-1, 318-2, 319. Heat sinks 332-1 and 332-2 may be on the outside of the wing boards 316-1 and 31-2, respectively. A retaining clip or band 334 may hold the various components of the 3-D scalable module 310 together.

Figure 4A:
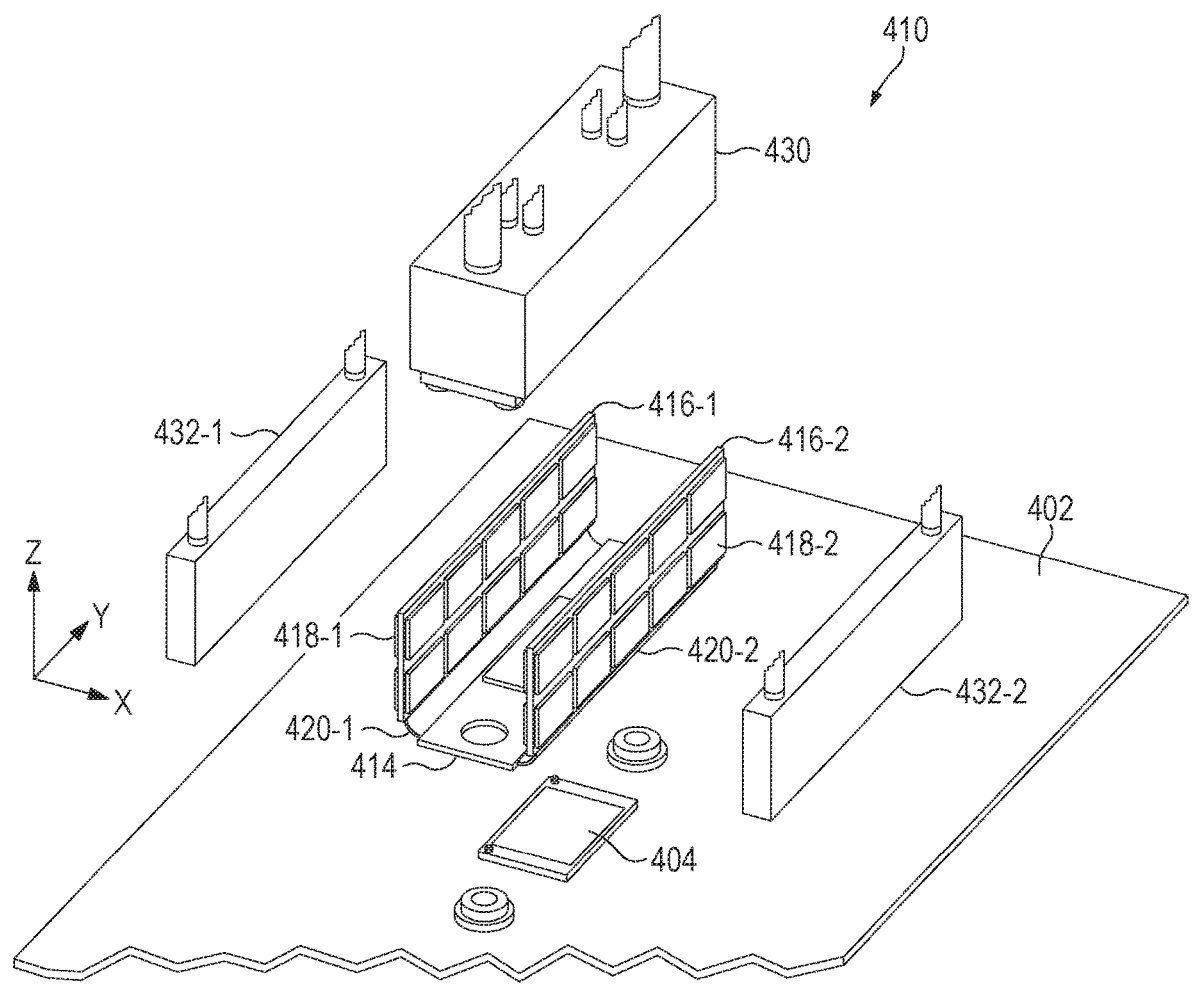
FIG. 4A depicts an example 3-D scalable module in an exploded perspective view.
Figure 4B:
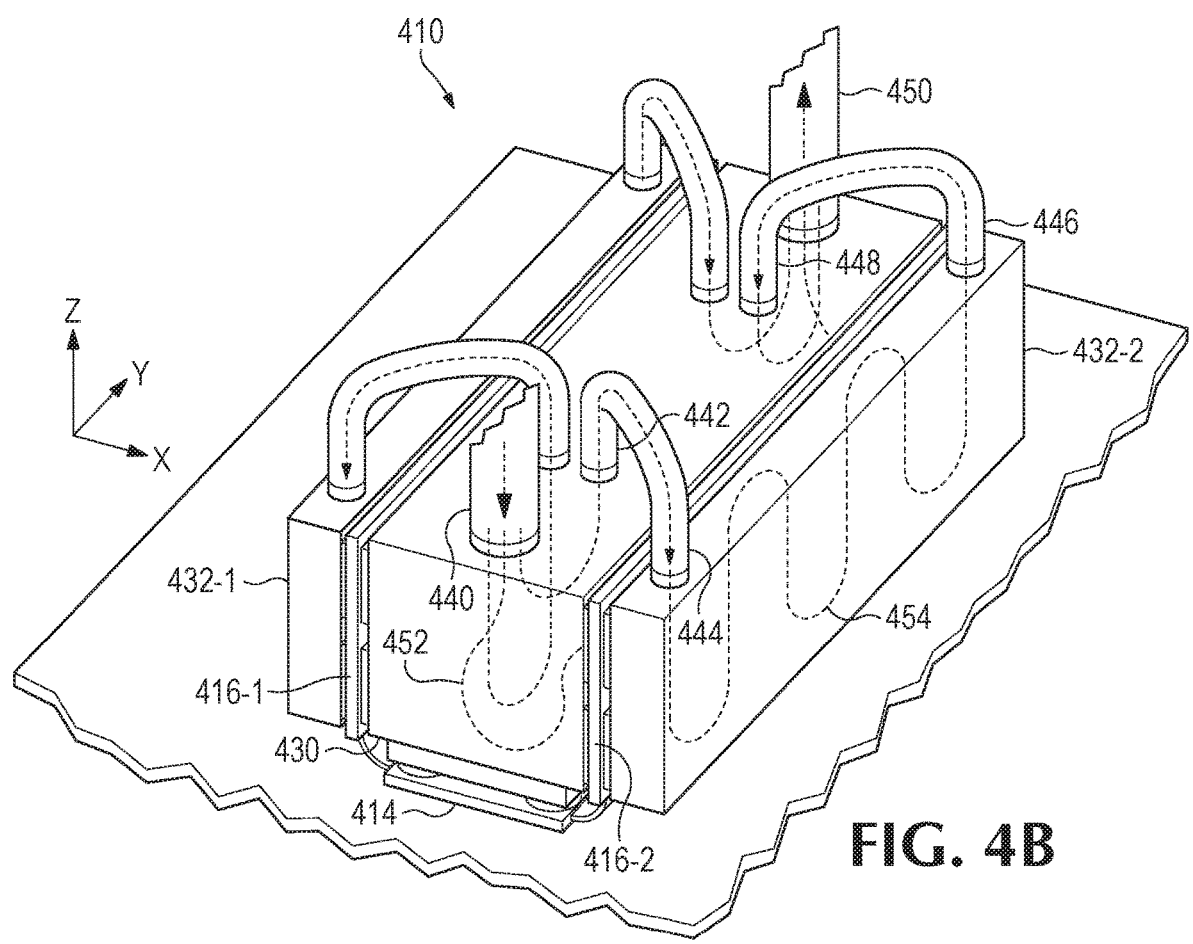
FIG. 4B depicts the example 3-D scalable module of FIG. 4A assembled and in a perspective view.

FIGS. 4A and 4B depict an example 3-D scalable module 410. In particular, FIG. 4A depicts the 3-D scalable module 410 in an exploded view, and FIG. 4B depicts the 3-D scalable module 410 as assembled. The 3-D scalable module 410 may be similar in many respects to the 3-D scalable module 310, but employs liquid cooling plates for thermal management instead of air-cooled heat sinks. The 3-D scalable module 410 includes a base board 414 with planar signal interface segment (not shown), by which the 3-D scalable module 410 can mate to a signal interface segment 404 on a system board 402. The 3-D scalable module 410 as depicted also includes vertically-oriented wing boards 416-1 and 416-2 with electronic devices 418-1 and 418-2 respectively (e.g., memory, processing resource, etc.), and flexible circuits 420-1 and 420-1 to connect respective wing boards 416-1 and 416-2 to the base board 414.

The 3-D scalable module 410 includes liquid cooling plates as thermal management, including a center plate 430 and auxiliary plates 432-1 and 432-2. The liquid cooling plates may be interleaved between the wing boards, in an order of auxiliary plate 432-1, wing board 416-1, center plate 430, wing board 416-2, and auxiliary plate 432-2. The center plate 430 includes a main cold inlet 440 that receives cool liquid. The liquid circulates from the inlet 440, within the center plate 430 along a fluid path 452 to extract heat from adjacent base board 414 and wing boards 416-1 and 416-2 (e.g., heat generated by electronic devices), and to a main hot outlet 450 of the center plate 430.

The liquid also circulates inside the center plate 430 from the inlet 440 to an auxiliary cool outlet 442 of the center plate 430, through a conduit to an auxiliary cool inlet 444 of an auxiliary plate 432-1, along a fluid path 454 within the auxiliary plate 432-1 to extract heat from an adjacent wing board 416-1, 416-2 (e.g., heat generated by electronic devices), to an auxiliary hot outlet 446 of the auxiliary plate 432-1, through a conduit to an auxiliary hot inlet 448 of the center plate 430, and then internally through the center plate 430 to the main hot outlet 450. The fluid path is depicted in FIG. 4B for the auxiliary plate 432-2, and would have a similar path for the auxiliary plate 432-1 (not depicted for clarity of illustration).

Figure 5A:
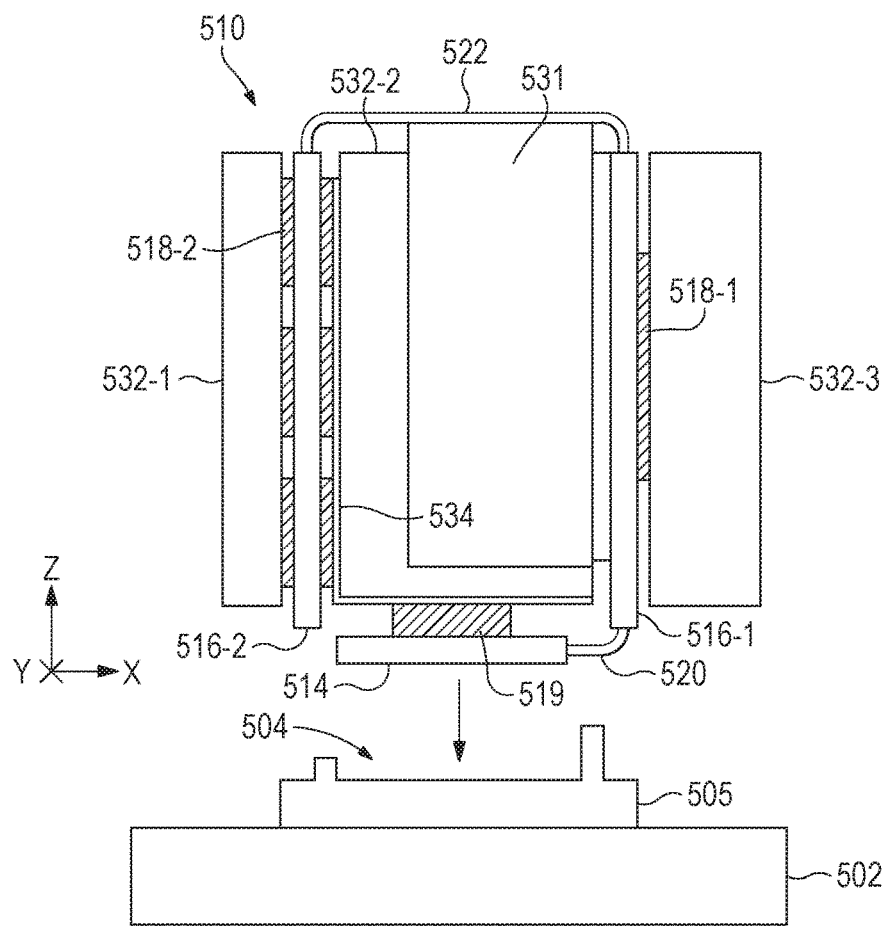
FIG. 5A depicts an example 3-D scalable module in a front view.
Figure 5B:
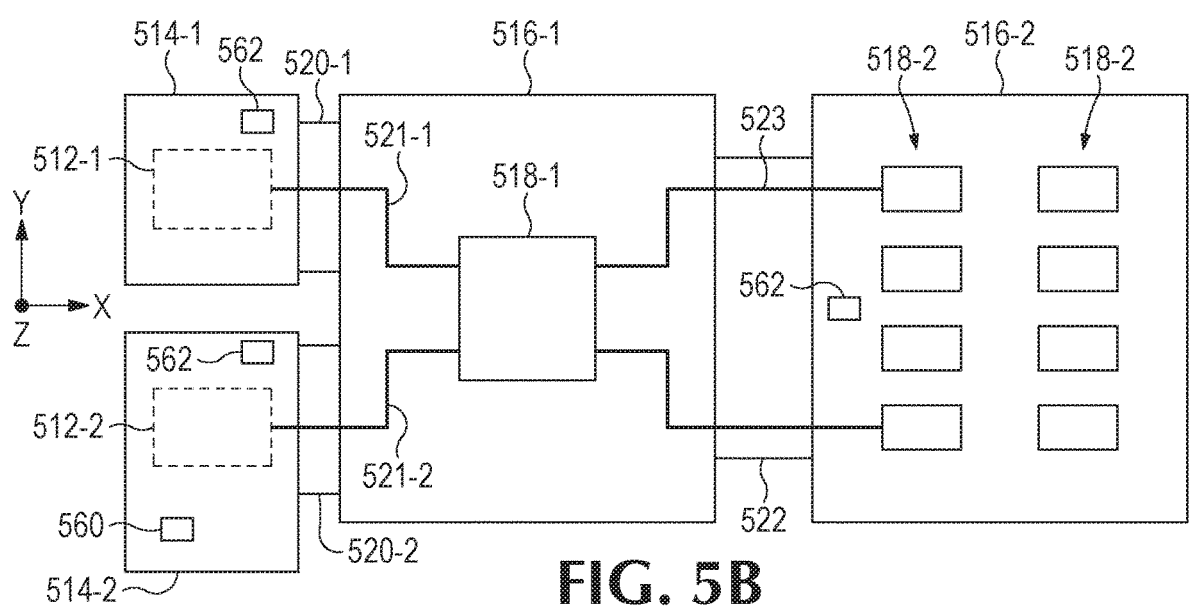
FIG. 5B depicts part of the example 3-D scalable module of FIG. 5A in an unfolded state.

FIGS. 5A and 5B depict another example 3-D scalable module. FIG. 5A depicts the example 3-D scalable module 510 in a front view, and FIG. 5B depicts part of the example 3-D scalable module 510 in an unfolded state, Many features of the 3-D scalable module 510 may be similar to analogous features of 3-D scalable modules 110, 310, 410 described above, as well as the apparatus 200. The 3-D scalable module 510 includes base board(s) 514 having planar signal interface(s) 512 on an underside (e.g., depicted in dashed lines in FIG. 5B), a first wing board 516-1 carrying an electronic device 518-1, and a second wing board 516-2 carrying an electronic device 518-2. In some implementations, an electronic device 519 may be disposed on the base board(s) 514. Electronic devices 518-1, 518-2, 519 may include a memory, processing resource, etc.

As described above, some implementations of 3-D scalable modules may have multiple base boards. FIG. 5B illustrates one such implementation, having two base boards 514-1 and 514-2 with respective planar signal interfaces 512-1 and 512-2. In some cases, having independent base boards 514-1, 514-2 and corresponding planar signal interfaces 512-1, 512-2 may allow for the same module 510 to be scalable in the X-Y plane and selectively couple to different numbers (e.g., one or two) of signal interface segments 504 on a system board 502, to provide different functionality to an electronic system in which a system board 502 is installed. The system board 502 may include a socket 505, which assists in mating the interface(s) 512-1, 512-2 to the segment 504.

The base boards 514-1 and 514-2 are connected to the first wing board 516-1 by respective flexible circuits 520-1 and 520-2. The flexible circuits 520-1 and 520-2 have respective traces 521-1 and 521-2 to carry signal, power, etc., between the planar signal interfaces 512-1 and 512-2 and the electronic device 518-1. The first wing board 516-1 is connected to the second wing board 516-2 by a flexible circuit 522, which has traces 523 to carry signal, power, etc. between the electronic devices 518-1 and 518-2 (or between electronic devices 518-1 or 518-2 and the planar signal interfaces 512-1 or 512-2, in some implementations). FIG. 5B depicts this arrangement of base board and wing boards in an unfolded state.

As shown in FIG. 5A, the 3-D scalable module 510 also includes a support block 531 and thermal management elements 532-1, 532-2, and 532-3. Heat spreaders and/or insulation may also be employed to control thermal conduction. When assembled, the base boards 514, the first wing board 516-1, and the second wing board 516-2 wrap around the support block 531, as well as the thermal management element 532-2. The thermal management elements 532-1 and 532-3 may be held to the outside of the wing boards 516-1 and 516-2 as depicted in FIG. 5A (e.g., by a retaining clip, bolts, etc.). Accordingly, such extension of wing boards 516-1, 516-2 in the Z-axis direction by wrapping allows for further scalability of the module 510.

In some implementations, the 3-D scalable module 510 may include a management controller 560 (shown in FIG. 5B). The management controller 560 may handle management signals received by the module 510 from the system board 502. The management controller 560 may also handle requests to remove the module 510 from the system board 502, such as processing of a removal request initiated by a activation of a removal request button on the module 510 (e.g., on a wing board or base board). The management controller 560 may also manage status lights on the module 510 (e.g., related to status of a removal request). In some implementations, the 3-D scalable module 510 may include voltage regulator(s) 562 (shown in FIG. 5B). Management controllers and voltage regulators may also be included in other 3-D scalable modules and apparatuses described herein.

Figure 6A:
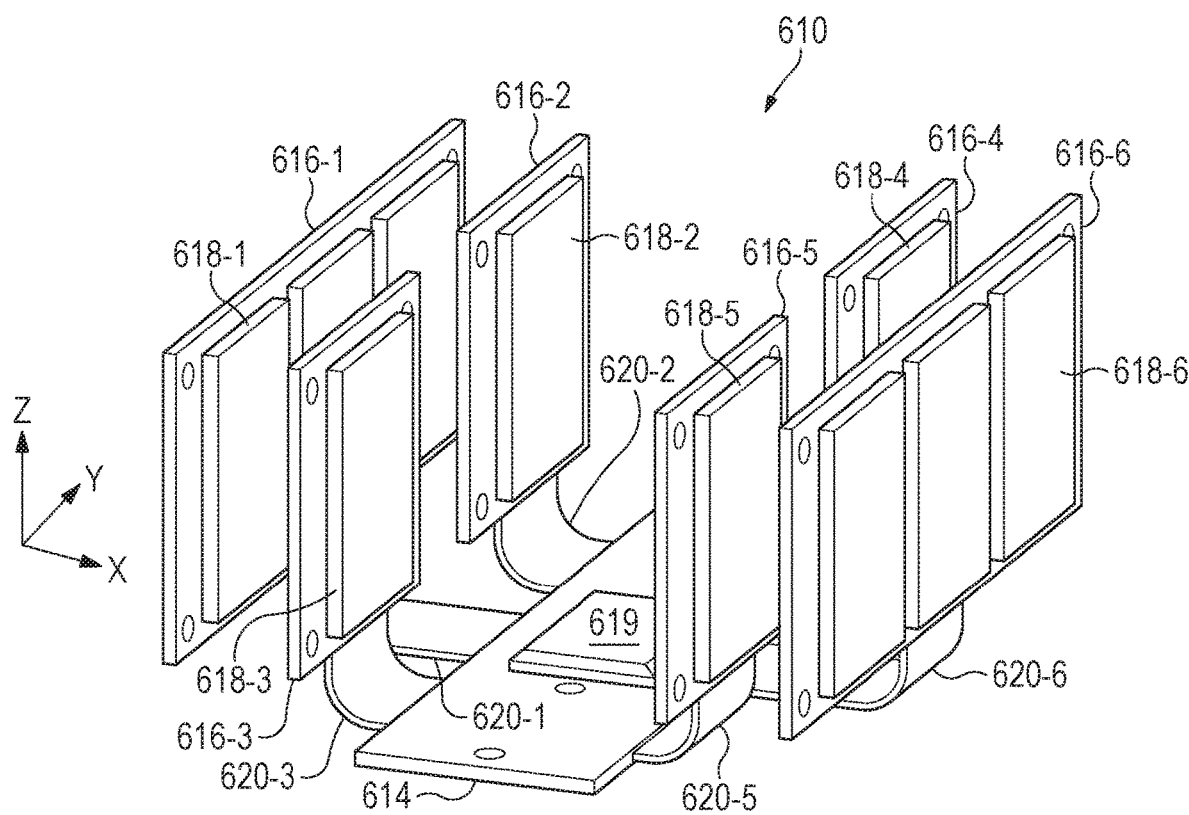
FIG. 6A depicts an example 3-D scalable module in a perspective view.
Figure 6B:
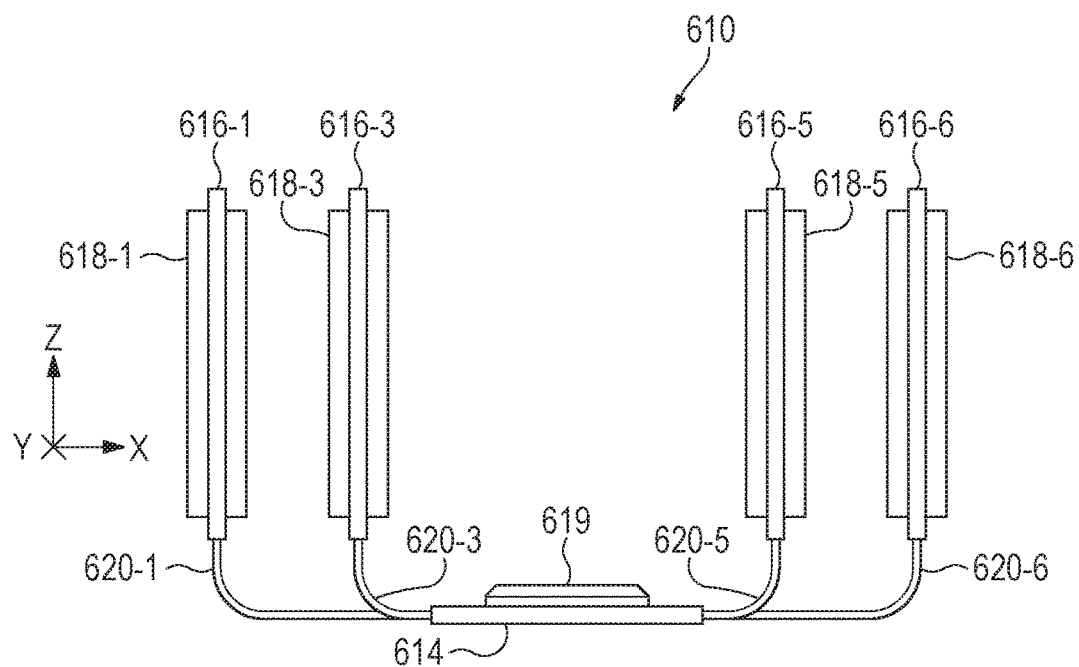
FIG. 6B depicts the example 3-D scalable module of FIG. 6A in a front view.
Figure 6C:
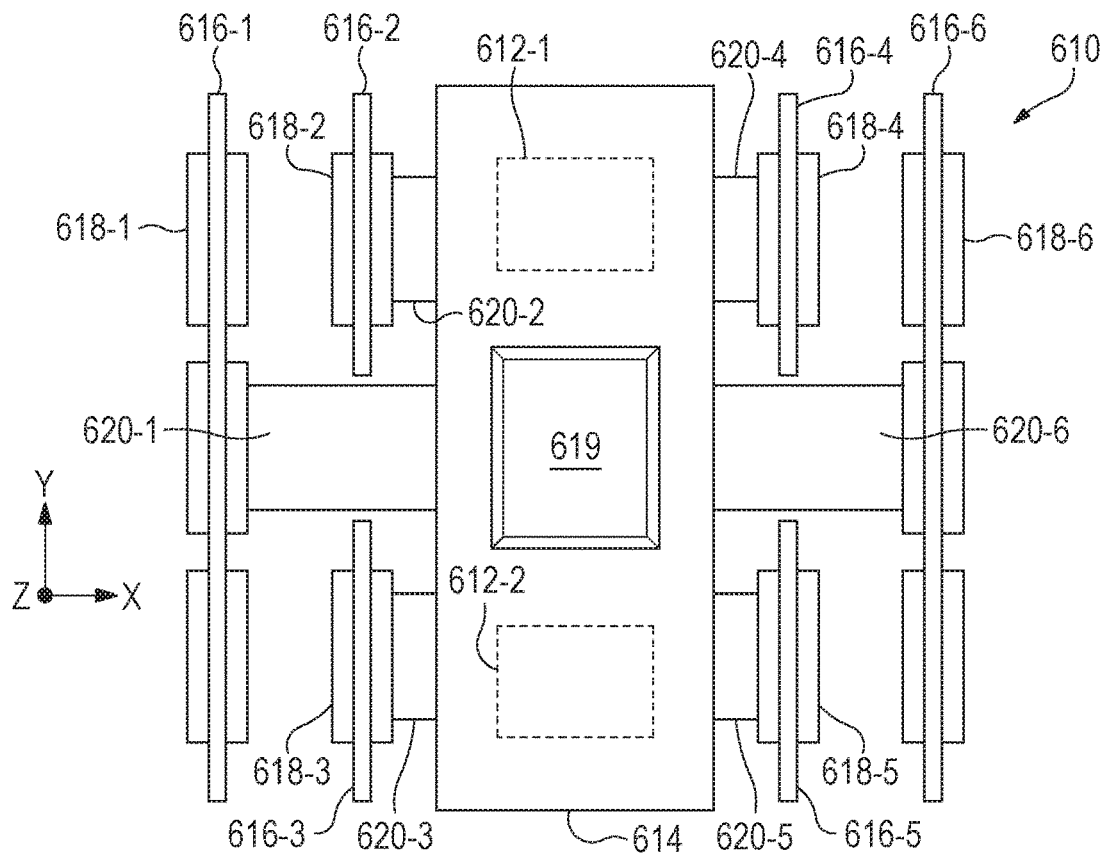
FIG. 6C depicts the example 3-D scalable module of FIG. 6A in a top view.

FIGS. 6A, 6B, and 60 depict an example 3-D scalable module 610, in a perspective view, a front view, and a top view, respectively. Many features of the 3-D scalable module 610 may be similar to analogous features of 3-D scalable modules 110, 310, 410, 510, and apparatus 200. The 3-D scalable module 610 has a base board 614 with planar signal interfaces 612-1 and 612-2 on an underside of the base board 614 (e.g., depicted in dashed lines in FIG. 6C). The base board 614 also includes an electronic device 619, such as a memory controller or processing resource. The base board 614 may be connected to a plurality of parallel wing boards by respective flexible circuits. The wing boards may be in a vertical orientation, similar to the wing boards of 3-D scalable modules 310 and 410. In comparison to the 3-D scalable modules 310 and 410, the 3-D scalable module 610 has a different arrangement of parallel wing boards. Similar to other modules described herein, the 3-D scalable module 610 may employ thermal management elements in some implementations (not shown).

In particular, a wing board 616-1 carries an electronic device 618-1 and is connected to the base board 614 via a flexible circuit 620-1, a wing board 616-2 carries an electronic device 618-2 and is connected to the base board 614 via a flexible circuit 620-2, a wing board 616-3 carries an electronic device 618-3 and is connected to the base board 614 via a flexible circuit 620-3, a wing board 616-4 carries an electronic device 618-4 and is connected to the base board 614 via a flexible circuit 620-4, a wing board 616-5 carries an electronic device 618-5 and is connected to the base board 614 via a flexible circuit 620-5, and a wing board 616-6 carries an electronic device 618-6 and is connected to the base board 614 via a flexible circuit 620-6.

Figure 7:
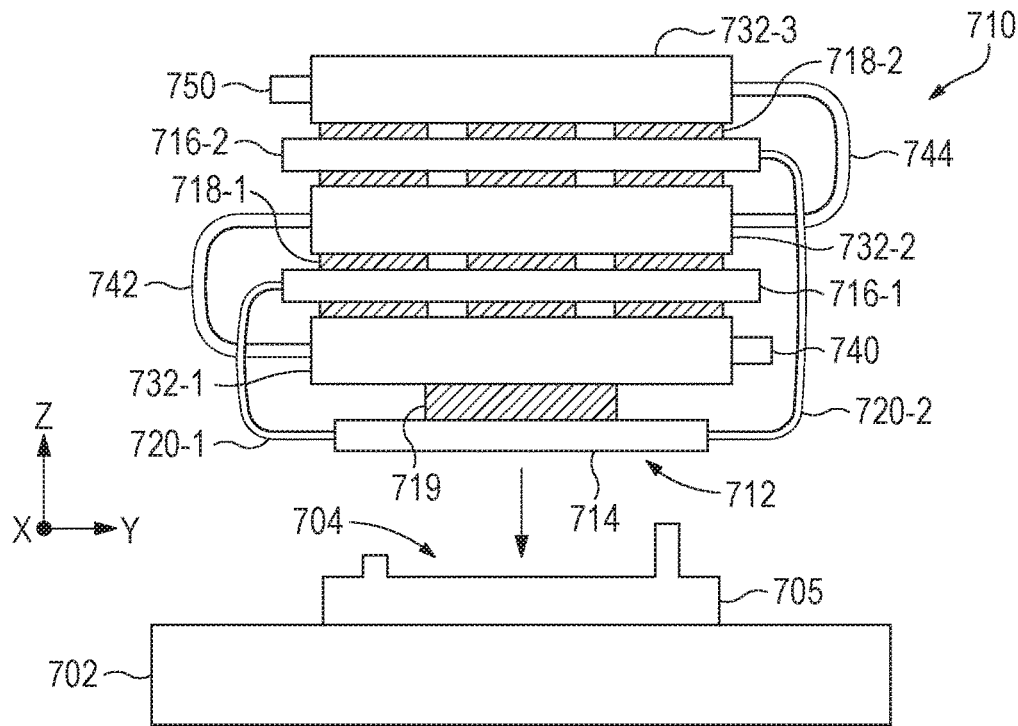
FIG. 7 depicts an example 3-D scalable module.

FIG. 7 depicts another example 3-D scalable module 710. The 3-D scalable module 710 includes a base board 714 with a planar signal interface 712 (on an underside of the base board 714), by which the 3-D scalable module 710 can mate to a signal interface segment 704 on a system board 702. The system board 702 may include a socket 705 to assist mating the interface 712 to the segment 704.

The base board 714 is connected to a plurality of wing boards by respective flexible circuits that carry data, power, etc. More particularly, the base board 714 is connected to a first wing board 716-1 by a flexible circuit 720-1, and the base board 714 is connected to a second wing board 716-2 by a flexible circuit 720-2. In some examples, the base board 714 may carry an electronic device 719 and the wing boards 716-1 and 716-2 may carry electronic devices 718-1 and 718-2 respectively (e.g., electronic devices may include memory, processing resource, etc.). The wing boards 716-1 and 716-2 are stacked in parallel to the base board 714.

Thermal management elements may be interleaved with the wing boards 716-1 and 716-2. In the example of the 3-D scalable module 710, liquid cooling plates 732-1, 732-2, 732-3 may be interleaved in the stack of wing boards, resulting in a stack ordered from the bottom-up including the base board 714, the plate 732-1, the wing board 716-1, the plate 732-2, the wing board 716-2, and the plate 732-3. The plates 732-1, 732-2, 732-3 may be connected via conduits 742 and 744 to form a continuous fluid path to extract heat from the wing boards. Coolant may be fed into the fluid path at a cold inlet 740 on plate 732-1 and may pass out through a hot outlet 750 on plate 732-3. The 3-D scalable module 710 may be designed with different configurations or numbers of stacked wing boards and/or thermal management elements, to scale the module 710 in at least the Z-axis direction.

In view of the foregoing, it may be understood that 3-D scalable modules 310, 410, 510, 610, 710 may scale in an X-Y plane and in a Z-axis direction differently from each other or may themselves be configured differently than shown. In one example, some of the example 3-D scalable modules 310, 410, 510, 610, 710, may be among the plurality of 3-D scalable modules 110 of the system 100 described above.

Figure 8:
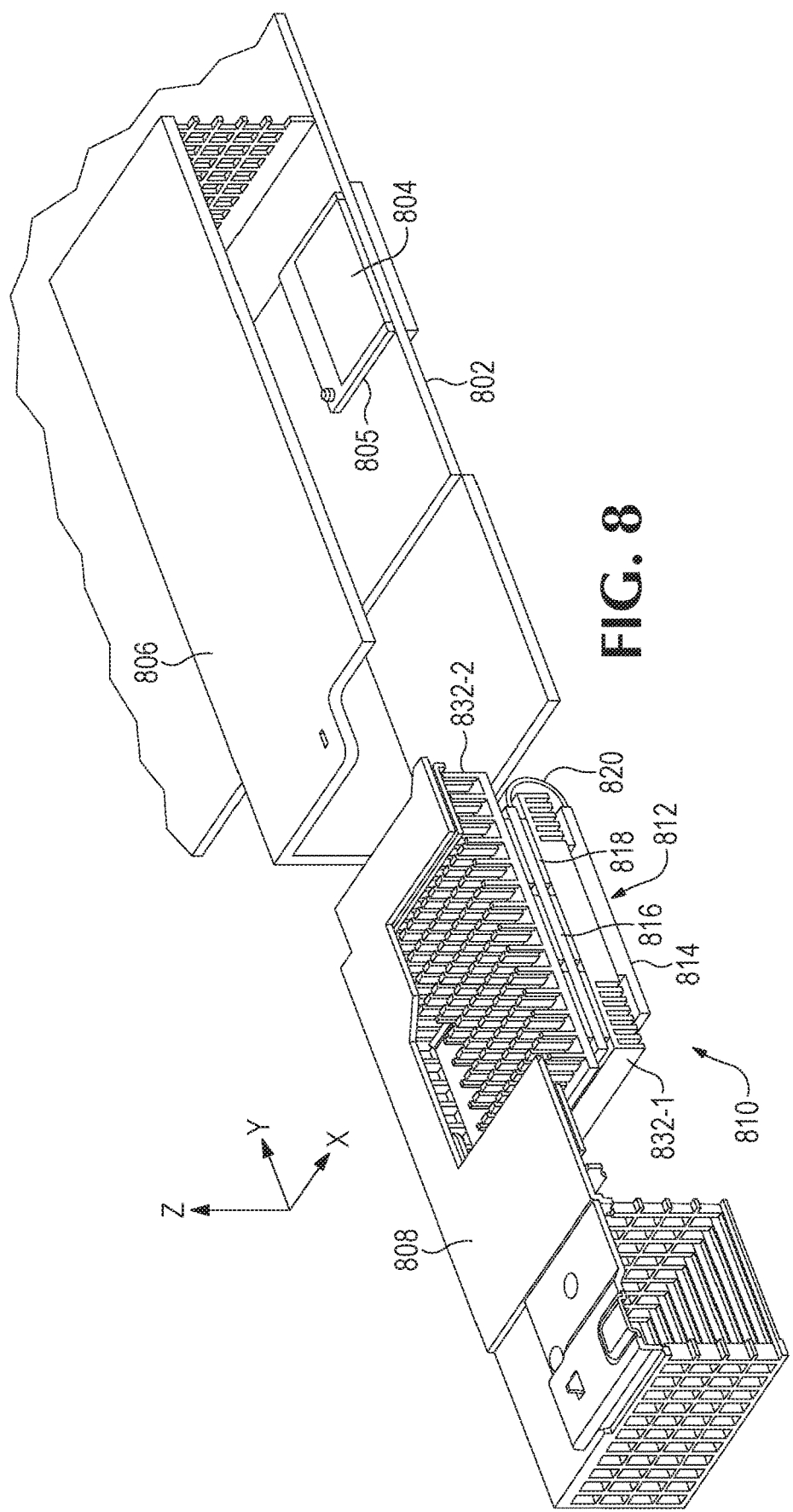
FIG. 8 depicts a cross-sectional view of an example front-serviceable 3-D scalable module.

FIG. 8 depicts a cross-sectional view of an example hot-pluggable and front-serviceable 3-D scalable module 810. The 3-D scalable module 810 includes a base board 814 with a planar signal interface 812 (on an underside of the base board 814). A flexible circuit 820 connects the base board 814 with a wing board 816, and the wing board 816 carries an electronic device 818 (e.g., memory, processing resource, etc.). Heat sinks 832-1 and 832-2 interleave the wing board 816 and the base board 814.

The 3-D scalable module 810 is packaged into a front-serviceable cage 808, which a user may insert into and remove from an expansion bay 806 of an electronic system.

Figure 9:
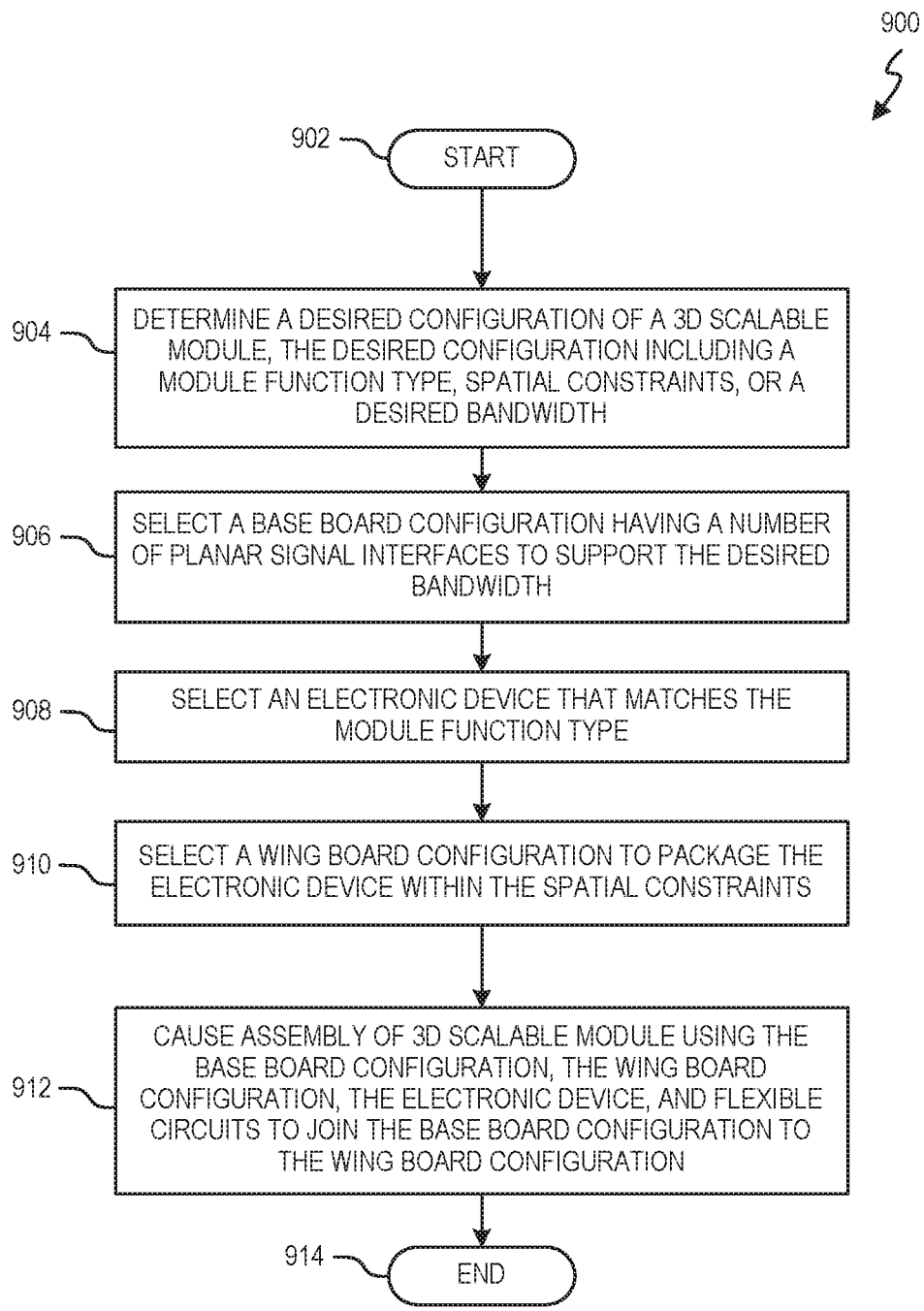
FIG. 9 depicts an example method for causing assembly of a 3-D scalable module.

The electronic system also includes a system board 802, having a signal interface segment 804 accompanied by a socket 805. The user may insert the cage 808 horizontally into the expansion bay 806, and features on the cage 808 and/or in the region of the expansion bay 806 assist in vertically blind-mating the planar signal interface 812 of the module 810 to the signal interface segment 804. For example, push-down springs or a system of roller bushings interacting with cam features may act as mating mechanisms, FIG. 9 depicts an example method 900 for causing assembly of a 3-D scalable module, such as the 3-D scalable modules 110. The method 900 starts at block 902, and at block 904, a desired configuration of a three-dimensionally scalable module is determined. The desired configuration may include a module function type, spatial constraints of an electronic system related to hot-plug installation of the scalable module, or a desired bandwidth between the scalable module and the electronic system.

At block 906, a base board configuration having a number of planar signal interfaces to support the desired bandwidth is selected. Generally, a greater number of planar signal interfaces may correlate to a higher bandwidth. The planar signal interfaces are to removably and parallelly couple to a system board of the electronic system. In some implementations, the base board configuration may include at least one base board to retain the number of planar signal interfaces.

At block 908, an electronic device that matches the module function type is selected. Some implementations may employ multiple electronic devices, which may be of the same type or different type. Example electronic device types may include a memory device or a processor device (e.g., SoC, GPU, CPU, ASIC, etc.).

At block 910, a wing board configuration to package the electronic device within the spatial constraints is selected. In some cases, spatial constraints may relate to the size of a docking bay or expansion bay of the electronic system, so that the 3-D scalable module may be inserted into and removed from the electronic system. Example wing board configurations may be analogous to the wing board configurations described above. For example, a wing board configuration may include a plurality of wing boards stacked in parallel to the base board (e.g., FIG. 7). Another wing board configuration may include a plurality of wing boards perpendicular to the base board (e.g., FIGS. 3A, 36, 4A, 46, 6A, 66, 6C). Dimensions of wing boards may be another aspect of wing board configuration that is selected to meet the spatial constraints.

At block 912, the 3-D scalable module is caused to be assembled using the base board configuration, the wing board configuration, the electronic device, and flexible circuits to join the base board configuration to the wing board configuration. The flexible circuits carry signals and power between the base board and the electronic device. The method 900 ends at block 914.

In the foregoing description, numerous details are set forth to provide an understanding of the subject matter disclosed herein. However, implementation may be practiced without some or all of these details. Other implementations may include modifications and variations from the details discussed above. It is intended that the following claims cover such modifications and variations.

What is claimed:

1. A system comprising:
a system board having a plurality of signal interface segments; and
a plurality of interchangeable three-dimensionally (3-D) scalable modules, each of the scalable modules including:
a planar signal interface to parallelly couple to a signal interface segment of the signal interface segments of the system board,
a base board that retains the planar signal interface,
a wing board,
an electronic device packaged on the wing board, and
a flexible circuit being a flexible linkage between the base board and the wing board, the flexible circuit having a signal path to communicatively couple the electronic device and the planar signal interface,
wherein at least some of the scalable modules have different numbers of planar signal interfaces to removably couple to different numbers of the signal interface segments.

2. The system of claim 1, wherein the electronic device includes memory, a system on chip, an encryption processor, a computing processor, or a graphics processing unit.

3. The system of claim 1, wherein
at least one of the scalable modules includes liquid cooling plates interleaved with wing boards of the at least one of the 3-D scalable modules, and
the liquid cooling plates includes a main cooling plate in thermal contact with a base board of the at least one of the scalable modules.

4. The system of claim 1, wherein the scalable modules are hot-pluggable and front-serviceable to an electronic system in which the system board is installed.

5. The system of claim 1, wherein the scalable modules are hot-pluggable and top-serviceable to an electronic system in which the system board is installed.

6. The system of claim 1, wherein the planar signal interface includes an optical interface.

7. The system of claim 1, wherein at least one of the scalable modules includes two planar signal interfaces to parallelly couple to two signal interface segments of the system board,
a first planar signal interface of the two planar signal interfaces is an optical interface, and
a second planar signal interface of the two planar signal interfaces is an electrical interface.

8. The system of claim 1, wherein at least one of the scalable modules includes a single base board having more than one planar signal interface that couples to more than one signal interface segment of the system board.

9. The system of claim 1, wherein at least one of the scalable modules includes a plurality of wing boards that scale dimensionally in a direction perpendicular to a plane of a base board of the at least one of the scalable modules.

10. An apparatus comprising:
a base board having a planar signal interface to couple parallelly to a selectable number of signal interface segments of a system board;
a plurality of wing boards to scale in a direction perpendicular to a plane of the base board;
an electronic device packaged on each of the wing boards; and
a flexible circuit being non-removably integral to the base board and non-removably integral to at least one of the wing boards, the at least one of the wing boards flexibly linked to the base board via the flexible circuit, and the flexible circuit having a signal path to communicatively couple the planar signal interface and an electronic device packaged on the at least one of the wing boards.

11. The apparatus of claim 10, wherein the electronic device includes memory, a system on chip, an encryption processor, a computing processor, or a graphics processing unit.

12. The apparatus of claim 10, wherein the flexible circuit forms part of a lamination of the base board and part of a lamination of the at least one of the wing boards.

13. The apparatus of claim 10, wherein the base board and the plurality of wing boards are packaged in a hot-pluggable and front-serviceable electronic system module.

14. The apparatus of claim 10, further comprising a support block, wherein
the plurality of wing boards includes a first wing board and a second wing board,
the first wing board being the at least one of the wing boards flexibly linked to the base board via the flexible circuit,
the second wing board being flexibly linked to the first wing board by another flexible circuit, and
the base board, the first wing board, and the second wing board wrap around the support block.

15. The apparatus of claim 10, wherein
each of the plurality of wing boards is coupled to the base board by a respective flexible circuit, and
the wing boards are stacked in parallel to the base board.

16. The apparatus of claim 10, wherein
each of the plurality of wing boards is coupled to the base board by a respective flexible circuit,
each of the plurality of wing boards is parallel to each other, and
the wing boards are perpendicular to the plane of the base board.

17. The apparatus of claim 10, further comprising thermal management elements interleaved with the plurality of wing boards.

18. The apparatus of claim 10, further comprising another electronic device packaged on the base board.

* * * * *